United States Patent [19]
Kobayashi

[11] Patent Number: 5,370,540
[45] Date of Patent: Dec. 6, 1994

[54] CIRCUIT BOARD CONNECTOR AND A BOARD USING THE SAME

[75] Inventor: Shigeyuki Kobayashi, Tokyo, Japan

[73] Assignee: Canon Kabushiki Kaisha, Tokyo, Japan

[21] Appl. No.: 141,579

[22] Filed: Oct. 27, 1993

Related U.S. Application Data

[63] Continuation of Ser. No. 861,376, Mar. 31, 1992, abandoned.

[30] Foreign Application Priority Data

Apr. 2, 1991 [JP] Japan .................................. 3-069666
Feb. 26, 1992 [JP] Japan .................................. 4-039163

[51] Int. Cl.$^5$ ............................................... H01R 9/09
[52] U.S. Cl. .......................................... 439/78; 439/590
[58] Field of Search ................... 439/78, 83, 590, 937; 206/329, 330

[56] References Cited

U.S. PATENT DOCUMENTS

| | | | |
|---|---|---|---|
| 3,517,803 | 6/1970 | Frompovicz | 206/329 |
| 4,056,300 | 11/1977 | Schumacher | 439/532 |
| 4,230,387 | 10/1980 | Zahn | 439/357 |
| 4,474,420 | 10/1984 | Nestor . | |
| 4,583,801 | 11/1985 | Zajeski | 439/751 |
| 4,586,607 | 5/1986 | Dubbs et al. | 206/329 |
| 4,655,517 | 4/1987 | Bryce | 439/880 |

FOREIGN PATENT DOCUMENTS 62-244414 9/1987 Japan .
63-101619 7/1988 Japan .

OTHER PUBLICATIONS

Circuit Assembly Corp. "Connectors" p. 60 Irvine, Calif. 1971.

Primary Examiner—Neil Abrams
Attorney, Agent, or Firm—Fitzpatrick, Cella, Harper & Scinto

[57] ABSTRACT

Disclosed are a circuit board connector which neither brings upon any defective conductivity due to the generation of crack and the like nor requires any separation even when the number of connector pins is great, and a board having a strong resistance against thermal effect. The circuit board connector is constructed so that a plurality of connector pins 1 held by a holder member 20 arranged in the longitudinal direction are inserted into holes 17 of circuit patterns in circuit board 7 for a subsequent soldering, and the holder member is constructed to be expandable, contractive, and deformable in the longitudinal direction.

6 Claims, 16 Drawing Sheets

F I G. 14
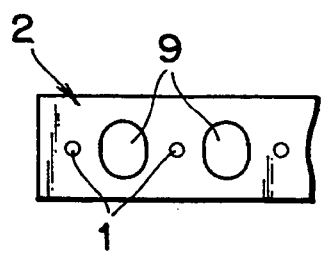
F I G. 15
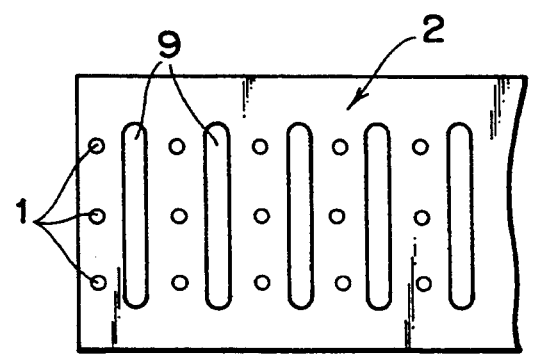
F I G. 16
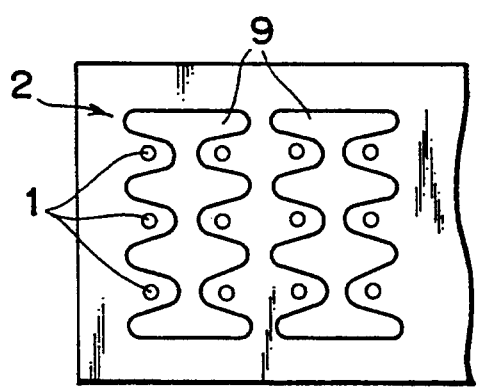

CIRCUIT BOARD CONNECTOR AND A BOARD USING THE SAME

This application is a continuation of application Ser. No. 07/861,376 filed Mar. 31, 1992, now abanondoned.

BACKGROUND OF THE INVENTION

1. Field of the Invention

The present invention relates to a circuit board connector and a board using this connector. More particularly, the invention relates to a circuit board connector mounted on a printed circuit board and a board using the connector.

2. Related Background Art

Traditionally, there has been known a circuit board connector mounted on a printing circuit board. A connector of such kind comprises a unit of male connector in which a plurality of connector pins are provided on the printed circuit board, and female connector which serves to secure an electrical conductivity for the male connector to prevent them from being fallen off. For this circuit board connector, there are typically a straight type in which the connector pins are planted on the surface of a mounting board almost vertically, and an edge type in which the connector pins are bent at right angles in the middle so that they are provided substantially in parallel with the surface of the mounting board.

Now, the description will be made briefly of a conventional straight type circuit board connector. FIG. 26 is a front view illustrating a conventional circuit board connector. In FIG. 26, the circuit board connector comprises a male connector portion 120 and a female connector portion 121 as a unit of one set. In the female connector portion 121, the connector terminals 124 represented by broken lines to which single lines 123 or flat cables (not shown) are connected are incorporated, and the electrical conductivity is implemented between each of the connector terminals 124 and connector pins 1 by the contacting force generated by the resilient deformation of the resilient portion of the connector terminals 124 when coupled with the connector pins 1. There are various types in practical use.

Also, the male connector portion 120 are provided with all the connector pins 1 almost vertically on the mounting surface of a circuit board 7. Therefore, the connector pins 1 are integrally formed with or pressed into a holder member 122 made of resin in advance, and after the end portions 1a of the connector pins 1 are inserted into the land holes of the circuit patterns on the surface of the circuit board 7, the integrated member is passed through a soldering flow tank or the like to form soldering portions 8 at once, thus performing the so-called soldering.

To the male connector portions 120 thus provided, the female connector portions 121 are pressed in detachably for use as a connector.

Particularly, when the male connector portions 120 in the circuit board connector are mounted, the temperatures of the circuit board 7 and the holder member 122 are considerably elevated, because the temperature at which the solder is solidified after the termination of the soldering is as high as one hundred and tens centigrade (°C.).

After that, the circuit board 7 and holder member 122 which have been expanded by thermal expansion in the direction indicated by an arrow X in FIG. 26 are contracted in the direction indicated by an arrow Y while getting to the equilibrium state to the room temperature. At this juncture, however, a difference in amount of the contraction occurs due to the materials used, shapes, dimentions, and the like of the circuit board 7 and holder member 122.

Furthermore, the resin circuit board 7 and holder member 122 are of water absorptive, resulting in a more difference in the amounts of the contraction by the expansion or contraction by moisture and the difference in the storage periods.

Now, FIG. 27 is a microscopic photographing view illustrating the breaking part of the end 1a of the connector pin 1 structured as shown in FIG. 26. This is the result of an observation and recording of a crack K which is generated subsequent to the solidification of the solder 8 after the pin has been inserted into the land 7a of the circuit board 7. This crack K has reached as far as approximatly a half of the circumference of the connector pin 1, and the soldering is effectuated only by the remaining portion of another half of the circumference. This crack K is conspicuous particularly when the number of the connector pins is great. Conventionally, in order to prevent this, a method is adopted to separate the holder member 122 if many numbers of the connector pins should be provided.

It has been vertified that such crack K is generated due to the difference in the amount of the contraction of the above-mentioned circuit board 7 and holder member 122, further, there is a problem that the crack K brings upon a conductivity deficiency eventually because the crack K further propagates due to an external force, vibration, or changes in temperature and moisture ($-10°$ to $85°$ C.) when the connector is used or stored as an electrical product.

Meanwhile, FIGS. 28A through 28C are views showing the processes in the conventional soldering flow and FIG. 28D illustrates the generation of a damage that the land 7b is peeled off when the female connector portion 30 is fitted onto the connector pin 1 which has been soldered in the processes shown in FIGS. 28A through 28C.

In other words, in FIG. 28A, the connector pin 1 integrally formed with the male connector 120 is inserted into the hole of the land portion 7b of the board 7. Then, when the integrated member is processed in a soldering flow equipment, there occurs a gap G as shown in FIG. 28B because the connector pin 1 which has been integrally formed with male connector portion 120 is raised from the board 7 by the flow of solder 8. Subsequently, after having waited for the solder to be solidified in the process shown in FIG. 28C, the female connector portion 30 is fitted as in FIG. 28D. Then, there encountered a problem in this process that the land 7b is peeled off from the board 1 at least by the amount equal to the gap G.

Also, the conventional connector is of rigid body in which the connector pins are integrally formed with resin, and there is no flexibility when it is mounted on a board. In addition, if the connector is mounted near a heat generating component such as a heating element or a motor, it is directly affected by heat. Hence, a problem happens that the electrical circuit between the board and the connector pins are broken and its function is disabled eventually.

Further, if a voltage is applied from a high voltage source to the connector pins in the circuit board as shown in FIG. 28, there is a problem that a discharge takes place between the pins if the interval between them is narrow.

Now, FIG. 29 is a view illustrating a copying machine (image formation apparatus) as an example of an apparatus using the connectors.

In FIG. 29, a reference mark a designates a case for the main body of the apparatus; b, a manuscript cover; c, an operation panel; d, a circuit board; and e, a transformer mounted on the circuit board d. Also, in the vicinity of the circuit board d, a motor f and other heat generating elements are arranged. A portion g surrounded by a circle represents a connector connected to the circuit board d. Inside the above-mentioned copying machine, an exposure unit, a development unit, a transfer unit, a photosensitive drum unit, sheet feed and exhaust unit, and the like are incorporated. For each of the units, a motor is arranged as a power source. For the smooth operation of each unit, particularly the development unit or the like, of a copying machine of the kind, heat is being added, and in the case of a machine in which the transformer, motor, and other heat generating elements are incorporated as in this example, there occur such problems as described above if the connector and circuit board are arranged in a close vicinity of those heat generating elements.

SUMMARY OF THE INVENTION

The present invention has been made in consideration of the above-mentioned actual situations. It is, therefore, an object of the present invention to provide a circuit board connector which neither brings upon any conductivity deficiency due to the generation of crack or the like nor requires any separation even when the number of the connector pins is great.

In order to solve the above-mentioned problems and achieve the object, a circuit board connector according to the present invention and a board using the aforesaid connector are constructed so that a plurality of connector pins held by a holder member arranged in a longitudinal direction are inserted into the holes of the circuit patterns in the circuit board for a subsequent soldering process. The holder member is constructed to be expandable, contractive and deformable in the longitudinal direction, thereby securing the freedom for mounting of the connector and absorbing the deformation of the holder member due to the thermal expansion and others.

Also, preferably, the holder member comprises holding portions of the connector pins and a resilient member for connecting the holding portions in the longitudinal direction. The resilient member is constructed to be expandable, contractive and defomable between the holding members which are adjacent to each other, thereby securing the freedom for mounting of the connector and absorbing the deformation of the holder member due to the thermal expansion and others.

Also, preferably, the resilient member is formed curved shape so as to be expandable, contractive and defomable between the holding members which are adjacent to each other, thereby securing the freedom for of the mounting connector and absorbing the deformation of the holder member due to the thermal expansion and others.

Also, preferably, the resilient member is provided only in one side of the column along the longitudinal direction, thereby securing the freedom for of the mounting connector and absorbing the deformation of the holder member due to the thermal expansion and other.

Also, preferably, the resilient member is provided alternately on both sides of the column along the longitudinal direction, thereby securing the freedom for of the mounting connector and absoring the deformation of the holder member due to the thermal expansion and others.

Also, preferably, a circuit board connector, in which a plurality of connector pins held by a holder member arranged in the longitudinal direction are inserted into the holes of the circuit pattern in the circuit board for a subsequent soldering, is constructed so as to allow the holder member to be expandable, contractive and deformable by the thermal contraction in the longitudinal direction to absorb any deformation due to the thermal contraction.

Also, preferably, a circuit board connector, in which a plurality of connector pins held by a holder member arranged in the longitudinal direction are inserted into the holes of the circuit pattern in the circuit board for a subsequent soldering, is provided with a groove, which is opened to the side face of the holder member, substantially rectangular to the longitudinal direction in order to construct said holder member to be deformable, so that the holder member is constructed to be expandable, contractive and deformable by the thermal contraction in the longitudinal direction to absorb any deformation due to the thermal contraction.

Also, preferably, the groove is provided with a bottom portion having a thickness which is smaller than the distance from the side face of the holder member to the center line of the connector pin arrangement, and is constructed deformable with the bottom as its pivot, so that the holder member is constructed to be expandable, contractive and deformable by the thermal contraction in the longitudinal direction to absorb any deformation due to the thermal contraction.

Also, preferably, the groove is provided alternately on both sides of the holder member so as to construct the holder member to be expandable, contractive and deformable by the thermal contraction in the longitudinal direction to absorb any deformation due to the thermal contraction.

Also, preferably, a circuit board connector, in which a plurality of connector pins held by a holder member arranged in the longitudinal direction are inserted into the holes of the circuit pattern in the circuit board for a subsequent soldering, is provided with a groove between the connector pins, so that the holder member is constructed to be expandable, contractive and deformable by the thermal contraction in the longitudinal direction to absorb any deformation due to the thermal contraction.

Also, preferably, a continuous concavity from a fixed position of the connector pin with respect to the holder member is provided so as to enable the expansion and contraction for the absorption of any deformation of the holder member.

Also, preferably, a concavity is provided between the connector pins so as to enable the expansion and contraction for the absorption of any deformation of the holder member.

Also, preferably, a hole is provided between the connector pins so as to enable the expansion and contraction for the absorption of any deformation of the holder member.

Also, preferably, the holder member is formed by a compound material of a hard resin and a soft resin so as to enable the expansion and contraction for the absorption of any deformation of the holder member.

Also, preferably, the connector pin is arranged in plural lines so that the number of the connector pin arrangement is increased.

Also, preferably, circuit board is constructed so that a circuit board connector is mounted thereon, in which a plurality of connector pins held by a holder member arranged in the longitudinal direction are inserted into the holes of the circuit pattern in the circuit board for a subsequent soldering said circuit board uses the circuit board connector constructed to allow the holder member to be expandable, contractive and deformable in the longitudinal direction, so that any connector defectives due to the thermal expansion and others can be prevented.

Also, preferably, the circuit board uses a circuit board connector in which the holder member comprises grooves provided between the connector pins so as to allow the holder member to be expandable contractive and deformable in the longitudinal direction, so that any connector defectives due to the thermal expansion and others can be prevented.

Also, preferably, the circuit board, uses a circuit board connector in which the holder member comprises holding portions of the connector pins and a resilient member connecting the holding portions in the longitudinal direction and is constructed so as to allow the resilient member to be expandable, contractive and deformable between the holding portions adjacent to each other, so that any connector defectives due to the thermal expansion can be prevented.

Also, preferably, the circuit board uses a circuit board connector constructed to allow the holder member to be expandable, contractive and deformable in the longitudinal direction to absorb any deformation due to the thermal contraction, so that any connector defectives due to the thermal expansion and others can be prevented.

Then, preferably, the circuit board uses a circuit board connector provided with a groove, which is opened to the side face of the holder member, substantially rectangular to the longitudinal direction so as to construct said holder member to be deformable, so that any connector defectives due to the thermal expansion and others can be prevented.

BRIEF DESCRIPTION OF THE DRAWINGS

FIG. 14 is a plan view illustrating a eighth embodiment of a circuit board connector according to the present invention.

FIGS. 15 through 17 are plan views illustrating each of the variations of the eighth embodiment.

DETAILED DESCRIPTION OF THE PREFERRED EMBODIMENTS

Figure 1:
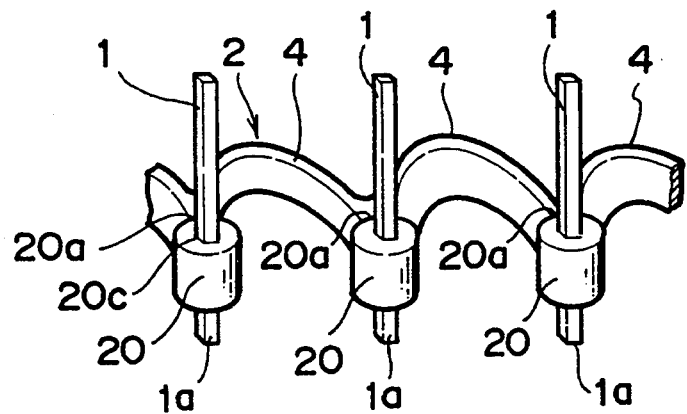
FIG. 1 is a perspective view illustrating the outer appearance of a first embodiment of a circuit board connector according to the present invention.

Hereinafter, the preferred embodiments according to the present invention and the examples of the variations thereof will be described in reference to the accompanying drawings. FIG. 1 is a perspective view illustrating the outer appearance of a first embodiment of a circuit board connector. The circuit board connectors which will be described hereinafter are of the straight type which has already been described, and the descriptions will be made preponderantly as to the structures of the male connector portions thereof.

In FIG. 1, a connector block 2 made of a resin material or the like is formed by a resin molding integrally with a principal parts 20 holding each of the connector pins 1 and curving portion 4 which connects the principal parts 20 as shown in FIG. 1. The curving portion 4 has a sufficient flexibility and is extended from a first coupling portion 20a of the principal part 20 in order to provide all the curving portions 4 on one side of the principal part 20 with respect to the principal parts 20. On the other hand, the connector pin 1 is mounted in the principal part 20 in which line end portions 1a which is a portion to be inserted into the board is insert-molded or fitted thereinto so as to slightly project downwardly as shown in FIG. 1.

Figure 2:
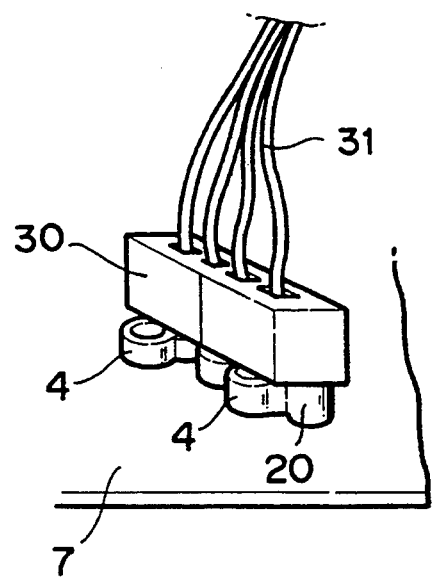
FIG. 2 is a view illustrating the state of the first embodiment shown in FIG. 1 in use.

The connector block 2 set forth above is inserted into a female connector portion 30 after having been mounted on a board 7 as shown in FIG. 2 illustrating the appearance of the connector. In this state, the curving portions 4 are of a circular arc shape, and with these portions 4, the deformation of the entire connector block 2 due to the thermal expansion and the like is absorbed so as to prevent the occurrence of any drawbacks such as a breakage of the connector block 2.

Figure 3:
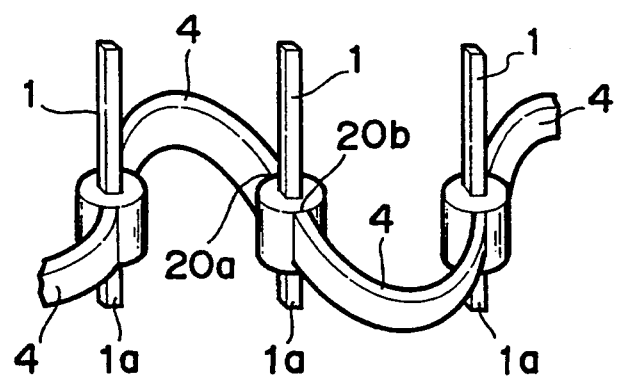
FIG. 3 is a perspective view illustrating the outer appearance of a second embodiment of a circuit board connector according to the present invention.

Now, FIG. 3 is a perspective view illustrating the appearance of a second embodiment of a circuit board connector according to the present invention. The description is defined to the structural parts which differ from the circuit board connector according to the first embodiment set forth above. The curving portion 4 is extended respectively from a first coupling portion 20a and a second coupling portion 20b with respect to the principal part 20 and is alternately provided in a staggered form on both sides of the principal portions 20 of the connector block 2 made of a resin material or the like.

Figure 4:
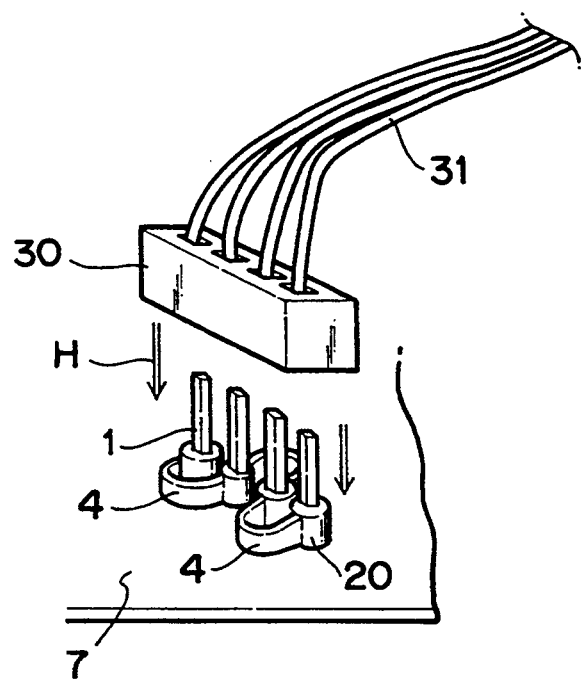
FIG. 4 is a view illustrating the state of the second embodiment shown in FIG. 3 in use.

The connector block 2 described above makes it possible after having been mounted on the board 7 to allow the female connector portion 30 to be inserted in the direction indicated by an arrow H as shown in FIG. 4. In this state, the curving portion 4 are of a circular arc shape, and with these portions 4, the deformation of the entire connector block 2 due to the thermal expansion and the like is absorbed so as to prevent the occurrence of any drawbacks such as a breakage of the connector block 2.

Figure 5A:
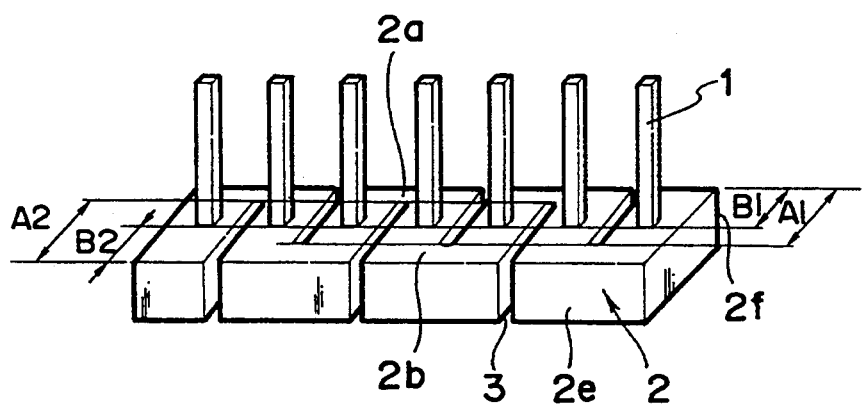
FIG. 5A is a perspective view illustrating the outer appearance of a third embodiment of a circuit board connector according to the present invention.
Figure 5B:
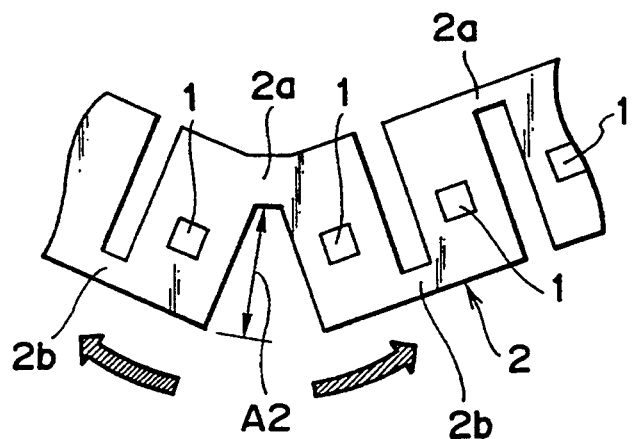
FIG. 5B is a view illustrating the state of the third embodiment shown in FIG. 5A in use.

Now, FIG. 5A is a perspective view illustrating a third embodiment of a circuit board connector according to the present invention. FIG. 5B is a plan view illustrating the operation (mounting) thereof. At first, in FIG. 5A, a groove 3, which is substantially perpendicular to the longitudinal direction of the connector block 2 and is opened to the side faces 2e and 2f, is formed alternately on both sides of the connector block 2 to structure the connector block 2 itself to be deformable as shown in FIG. 5A. The depths A1 and A2 of these grooves 3 are defined to be greater than the distances B1 and B2 from the side faces to the center line of arrangement of the connector pin 1, and each of the bottom portions 2a, and 2b of the grooves 3 is structured to allow itself to sever as a center of rotation. In other words, as shown in the plan view represented by FIG. 5B, the connector block 2 is opened in the direction indicated by arrows in FIG. 5B in order to match it with the land pattern of the board, whereby the connector block is opened with the bottom 2a as its rotational center and the connector pin 1 is held without being affected thereby.

Figure 6:
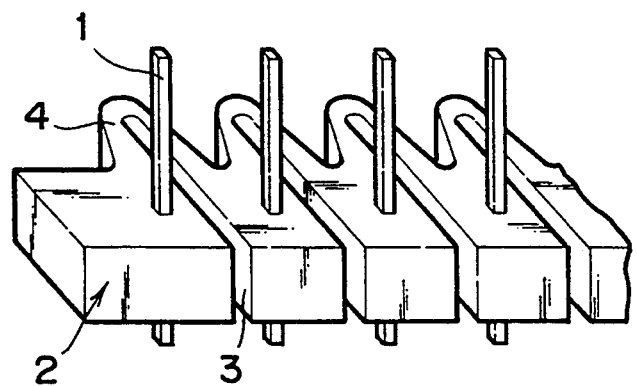
FIG. 6 is a perspective view illustrating the outer appearance of a fourth embodiment of a circuit board connector according to the present invention.

Subsequently, FIG. 6 is a view illustrating the appearance of a fourth embodiment of a circuit board connector according to the present invention, in which the connector pins 1 are integrally provided by an insert injection molding in order to align the connector pins 1 in the longitudinal direction on the mounting surface of the board in a substantially vertical state. The connector pins 1 are made of copper and others and are of a square column type as shown in FIG. 6 with its surface being plated with gold and others. Thus, it is implemented to prevent them from being fallen off after the insert injection molding or being fitted thereinto while securing the area to receive the above-mentioned contacting force. Between the connector pins 1 thus provided, grooves 3 are formed as shown in FIG. 6 and curving portions 4 are arranged so as to form the respective bottoms of the grooves.

When the male connector described above is soldered to a circuit board, the grooves 3 and curving portions 4 of the connector block 2 serve to absorb the thermal contraction differential between the circuit board and connector block 2 due to the solder solidification. As a result, it becomes possible to prevent the generation of any crack. Also, it is unnecessary to separate the connector block 2 even when the number of the connector pins 1 is great.

Figure 7:
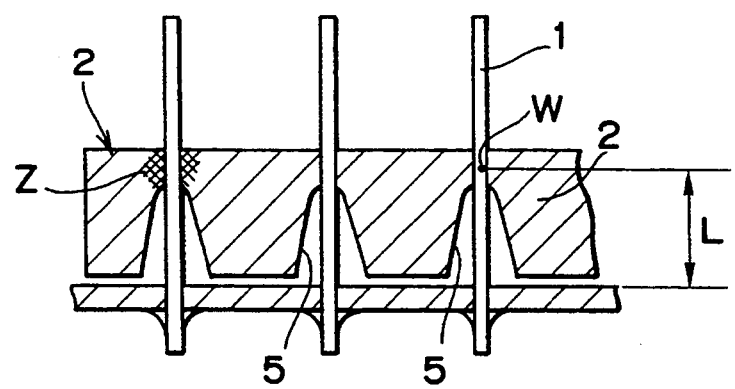
FIG. 7 is a broken view showing an example of a variation of the fourthe embodiment.

FIG. 7 is a broken view of the fourth embodiment of the circuit board connector in the longitudinal direction, in which the connector block 2 made of a resin material or the like is integrally provided with the above-mentioned connector pins 1 by insert injection molding or fitting thereinto in order to align all the connector pins 1 in the longitudinal direction on the mounting surface of the board in a substantially vertical state. The connector pins 1 are fixedly supported at the bottoms of concavities 5.

When the male connector thus formed is soldered to a circuit board, the thermal contraction differential between the circuit board and the connector block 2 due to the solder solidification can be absorbed by the thinned portions (indicated by the cross-hatching Z in FIG. 7) of the concavities 5 of the connector block 2. Consequently, it becomes possible to prevent the generation of any crack because the effect produced by stress concentration is increased.

In the meantime, the connector pins 1 are held by the thinned portions which are away from the board by a distance L. Therefore, the inclination of the connector pins 1 due to the displacement amount of the connector block 2 can be minimized. Also, it is unnecessary to separate the connector block 2 even when the number of the connector pins 1 is great.

Figure 8:
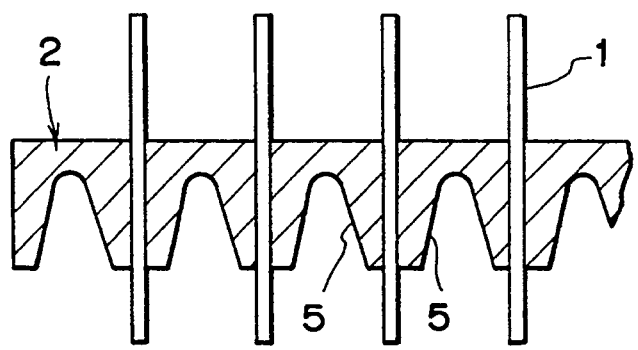
FIG. 8 is a broken view illustrating a fifth embodiment of a circuit board connector according to the present invention.

Now, FIG. 8 is a broken view showing a variation of the fourth embodiment, in which the same reference numerals are given to the constituents which have already been described, and the descriptions thereof are omitted. Thus, only those which differ therefrom will be described. The concavities 5 are respectively formed between the connector pins 1 as shown in FIG. 8. When the male connector thus formed are soldered to the circuit board, the thermal contraction differential between the circuit board and connector block 2 due to the solder solidification can be absorbed by the concavities 5 of the connector block 2. Hence, the generation of any crack can be prevented. Also, it is unnecessary to separate the connector block 2 even when the number of the connector pins 1 is great.

Figure 9:
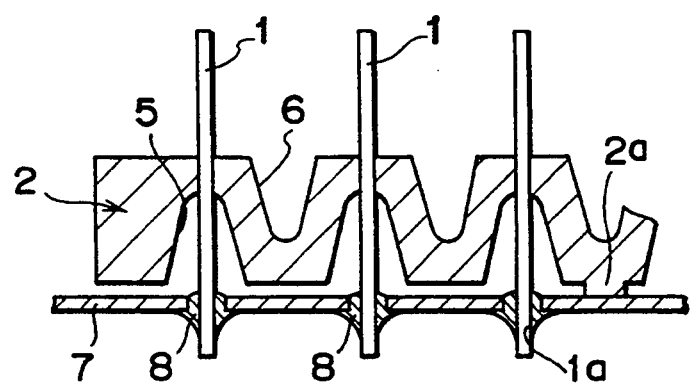
FIG. 9 is a broken view illustrating a sixth embodiment of a circuit board connector according to the present invention.

In continuation, FIG. 9 is a broken view showing a variation of the sixth embodiment, which represents the state after the soldering to the circuit board 7. In FIG. 9, sub-concavities 6 are formed between the concavities 5 which are arranged to fix the connector pins 1 at the bottom portions thereof. When the male connector thus formed are soldered to the circuit board, the thermal contraction differential between the circuit board and connector block 2 due to the solder solidification can be absorbed by the concavities 5 and sub-concavities 6 of the connector block 2 efficiently. Hence, the generation of any crack can be prevented. Also, it is unnecessary to separate the connector block 2 even when the number of the connector pins 1 is great.

Figure 10:
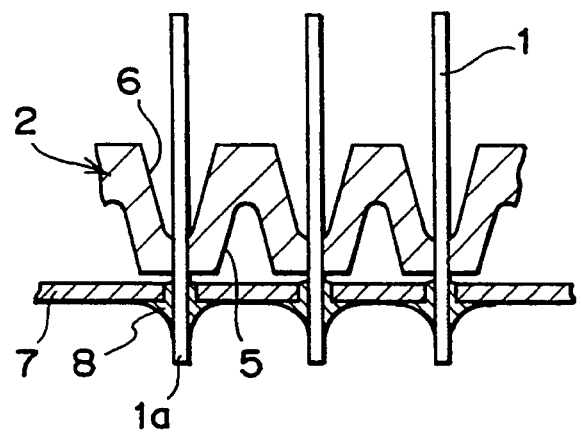
FIG. 10 is a broken view illustrating a seventh embodiment of a circuit board connector according to the present invention.
Figure 11:
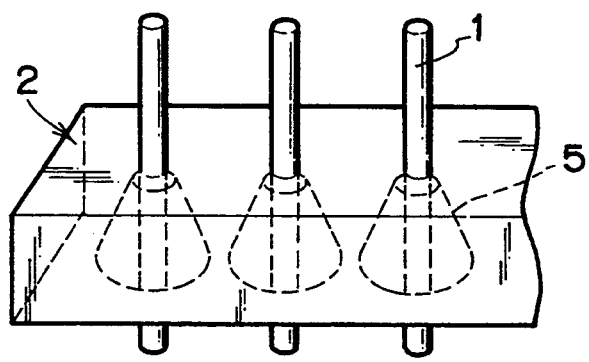
FIG. 11 is a perspective view illustrating the outer appearance of an example of a variation of the seventh embodiment.

According to the connectors shown in FIGS. 9 through 11, it is possible to employ the connectors in the circuit board in which the intervals of the through holes of the circuit board are made greater to make the pitches of holes ununiform in order to avoid any discharge between the connector pins caused by the aforesaid high voltage power source.

Also, FIG. 10 is a broken view showing a variation of the seventh embodiment, which represents the state after the soldering to the circuit board 7. In FIG. 10, the top and bottom shown in FIG. 5 are inverted and the connector pins 1 are fixed at the bottoms thus inverted. When the male connector thus formed is soldered to the circuit board, the thermal contraction differential between the circuit board and connector block 2 due to the solder solidification can be absorbed by the concavities 5 and sub-concavities 6 of the connector block 2 efficiently. Hence, the generation of any crack can be prevented. Also, it is unnecessary to separate the connector block 2 even when the number of the connector pins 1 is great.

Further, FIG. 11 is a perspective view illustrating the appearance of a variation of the fifth embodiment, in which the same reference numerals are given to the constituents which have already been described, and the descriptions thereof are omitted. Thus, only those which differ therefrom will be described. The concavities 5 are formed in a substantially conical shape with the fixed portion of the connector pin 1 as its center as shown in FIG. 11 (indicated by broken lines), thus making it possible to minimize the thermal effect of soldering transmitted through the connector pins 1. Meanwhile, when the male connector thus formed is soldered to the circuit board, the thermal contraction differential between the circuit board and connector block 2 due to the solder solidification can be absorbed by the concavities 5 of the connector block 2 efficiently, thereby enabling the prevention of any crack generation. Also, it becomes unnecessary to separate the connector block 2 even when the number of the connector pins 1 is great.

Figure 12:
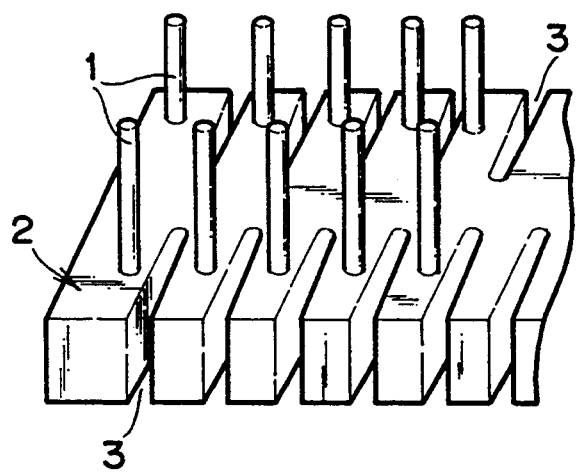
FIG. 12 is a perspective view illustrating an example of a variation.

Now, FIG. 12 is a perspective view illustrating the appearance of a variation of the fourth embodiment, in which the same reference numerals are given to the con-constituents which have already been described, and the descriptions thereof are omitted. Thus, only those which differ therefrom will be described. One end of each of the grooves 3 is arranged to be opened to each side of the connector block 2, while two lines of the connector pins 1 are aligned in the longitudinal direction as shown in FIG. 12.

Figure 13:
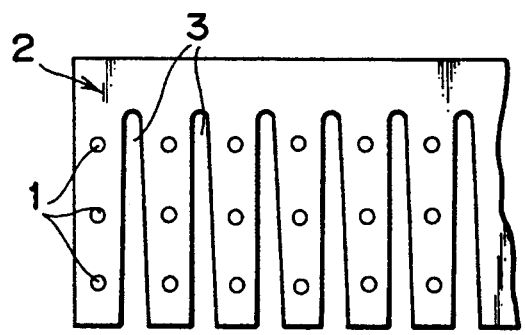
FIG. 13 is a plan view illustrating an example of variation.

Also, FIG. 13 is a plan view showing another variation of the fourth embodiment. As shown in FIG. 13, while three lines of the connector pins 1 are provided in the longitudinal direction of the connector block 2, each of the grooves 3 is provided between the connector pins 1 with its one end being arranged to be opened.

As described above, where the plural lines of the connector pins are formed, the generation of any crack can be prevented likewise. Also, becomes unnecessary to separate the connector block 2 even when the number of the connector pins 1 is great.

Now, FIG. 14 is a plan view showing a eighth embodiment of a circuit board connector according to the present invention, in which through holes 9 are provided between the connector pins 1.

Also, FIG. 15 is a plan view showing a variation of the eighth embodiment, in which oval through holes 9 are provided between the connector pins 1 arranged in three lines.

Then, FIG. 16 is a plan view showing another variation of the eighth embodiment, in which through holes 9 having different shape as shown in FIG. 16 are provided between the connector pins 1 arranged in three lines.

Figure 17:
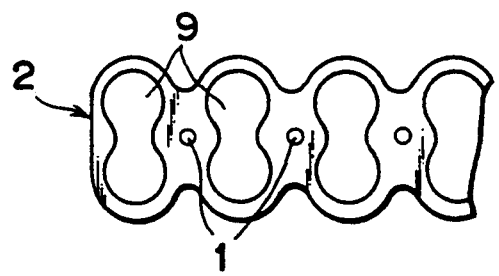

FIG. 17 is a plan view showing also a variation of the eighth embodiment, in which through holes 9 having different shape as shown in FIG. 17 are provided between the connector pins 1.

Now, when each of the male connectors thus formed (FIG. 14 through FIG. 17) is soldered to a circuit board, the thermal contraction differential between the circuit board and connector block 2 due to the solder solidification can be absorbed by the concavities 9 of the connector block 2 efficiently. Hence, the generation of any crack can be prevented. Also, it becomes unnecessary to separate the connector block 2 even when the numer of the connector pins 1 is great.

Figure 18:
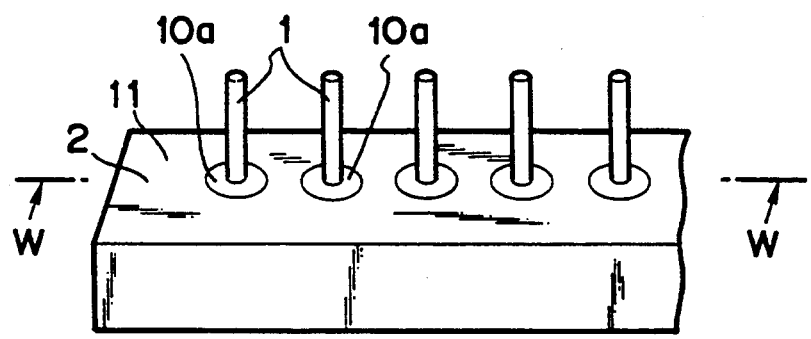
FIG. 18 is a perspective view illustraing the outer appearance of an example of a variation of the ninth embodiment.
Figure 19:
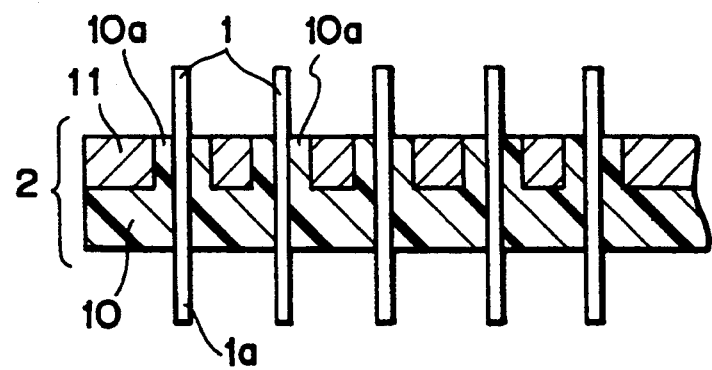
FIG. 19 is a cross-sectional view taken along the line W—W in FIG. 18.

Subsequently, FIG. 18 is a perspective view illustrating the appearance of a ninth embodiment of a circuit board connector according to the present invention. FIG. 19 is a cross-sectional view taken along the line W—W in FIG. 18. In FIGS. 18 and 19, the connector pins 1 are fixed with respect to the end portions 10a of a soft resin portion 10 which forms the connector block 2, and this soft resin portion 10 is surrounded by a hard resin portion 11.

Figure 20:
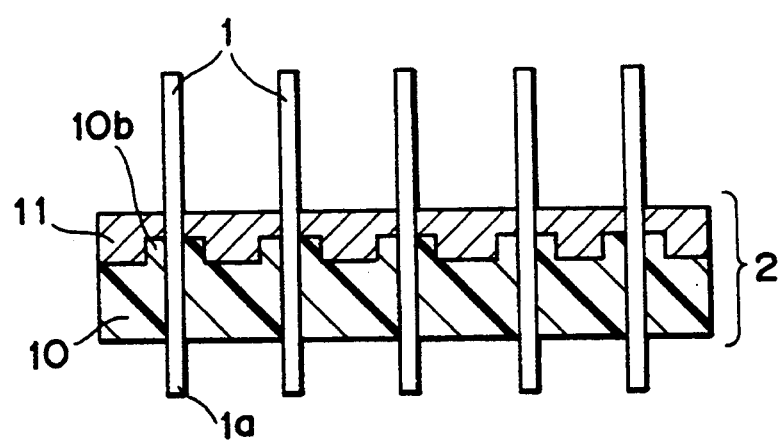
FIG. 20 is a cross-sectional view illustrating an example of a variation of the ninth embodiment.

Then, FIG. 20 is a broken view showing a variation of the ninth embodiment, in which while the connector pins 1 are supported by the soft resin portion 10 and the projections 10b of the soft resin portion 10, a hard resin portion 11 is provided on the upper layer thereof.

Now, when each of the male connectors thus formed (FIG. 18 through FIG. 20) is soldered to a circuit board, the thermal contraction differential between the circuit board and connector block 2 due to the solder solidification can be absorbed by the soft resin portion 10 of the connector block 2 efficiently. Hence, the generation of any crack can be prevented. Also, it becomes unnecessary to separate the connector 2 even when the number of the connector pins 1 is great.

Figure 21:
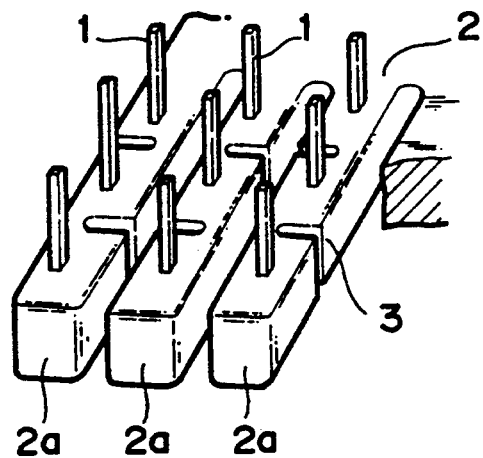
FIGS. 21 through 24 are perspective views illustrating the examples of variations.
Figure 22A:
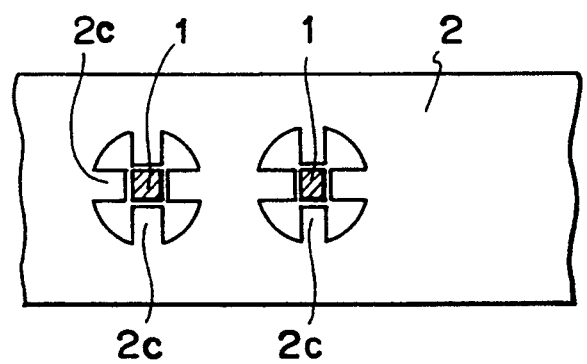
Figure 22B:
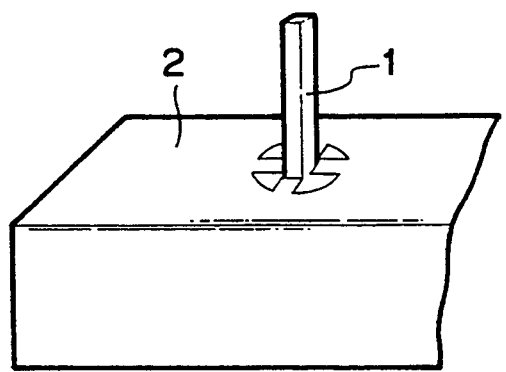
Figure 23A:
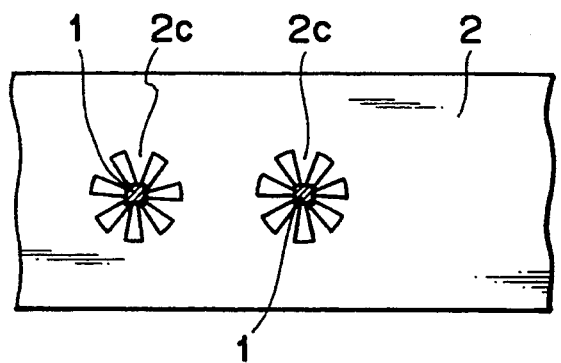
Figure 23B:
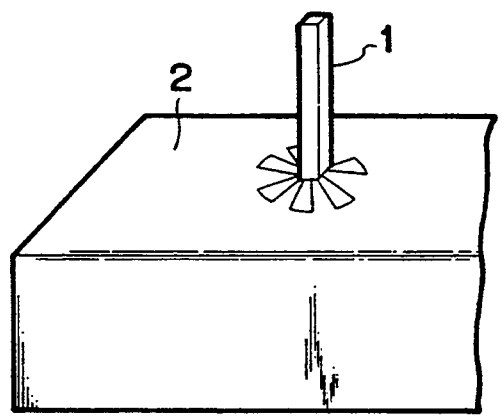

Subsequently, FIG. 21 is a perspective view illustrating the appearance of the example of a variation, in which divisional portions 2a are formed by dividing the connector block 2 into many numbers as shown in FIG. 21 in order to divide the lines of the connectors 1 into plural portions, and grooves 3 are provided between the connector pins 1. In this way, the plural lines of connector pins 1 can be arranged.

Further, FIGS. 22A and 22B, and FIGS. 23A and 23B are plan views and perspective views illustrating the appearance of variations, respectively, in which tooth-shaped portions 2c are integrally formed with the connector block 2 for supporting the outer periphery of the connector pins 1 in order to fit thereinto and hold the connector pins 1.

It may be possible to hold the connector pins 1 with the above-mentioned tooth-shaped portions 2c for absorbing the dimensional change of the connector block 2.

Figure 24A:
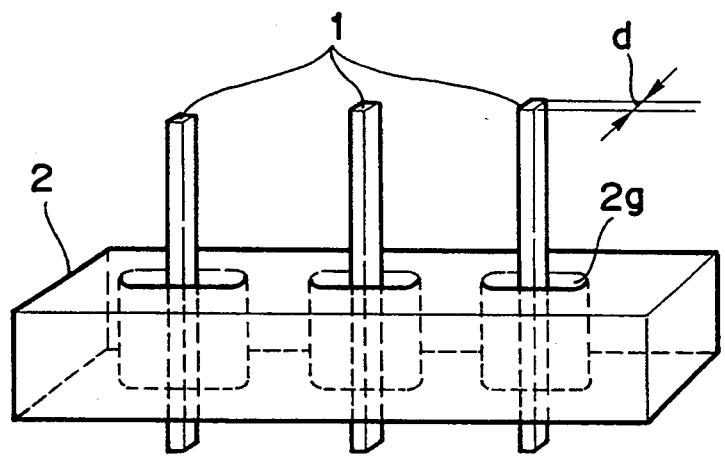
Figure 24B:
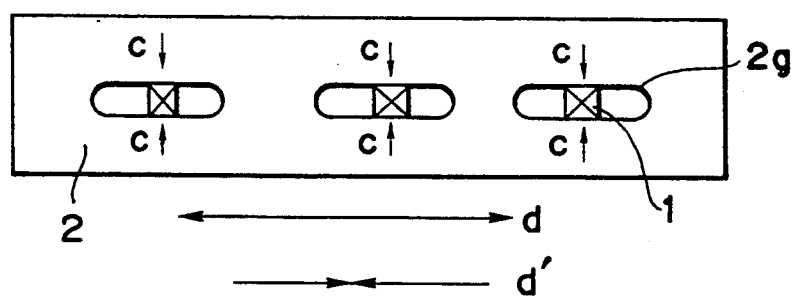

Lastly, FIG. 24A is a perspective view illustrating the appearance of the example of a variation and FIG. 24B is a plan view thereof, in which elongated holes 2g are integrally formed with the connector block 2 in a width dimension the inner width of which is slightly narrower than a dimension d of the connector pin 1 to fit thereinto and hold the connector pin 1 having the width dimension d therewith.

With the structure described above, the connector pins 1 are being held by pressure exerted in the direction indicated by arrows c in FIG. 24B when the connector pins 1 are fitted into the elongated holes 2g for holding.

With the structure described above, it is possible to absorb the displacement amount with the connector pins 1 which slide in the elongated holes 2g when the expansion and contraction take place in the direction to d and d' in FIG. 24B.

Figure 25:
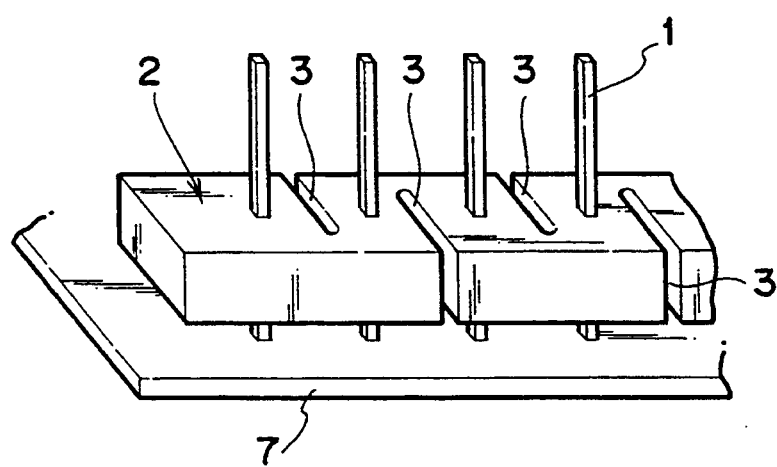
FIG. 25 is a view illustrating the outer appearance of a circuit board connector according to the thrid embodiment of the present invention, which is mounted on a board 7 while keeping its original shape.
Figure 26:
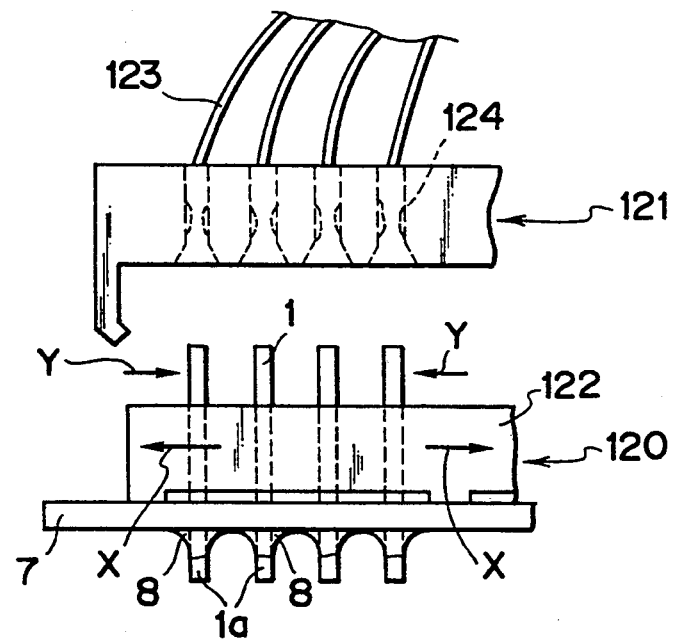
FIG. 26 is a front view showing a conventional circuit board connector.
Figure 27:
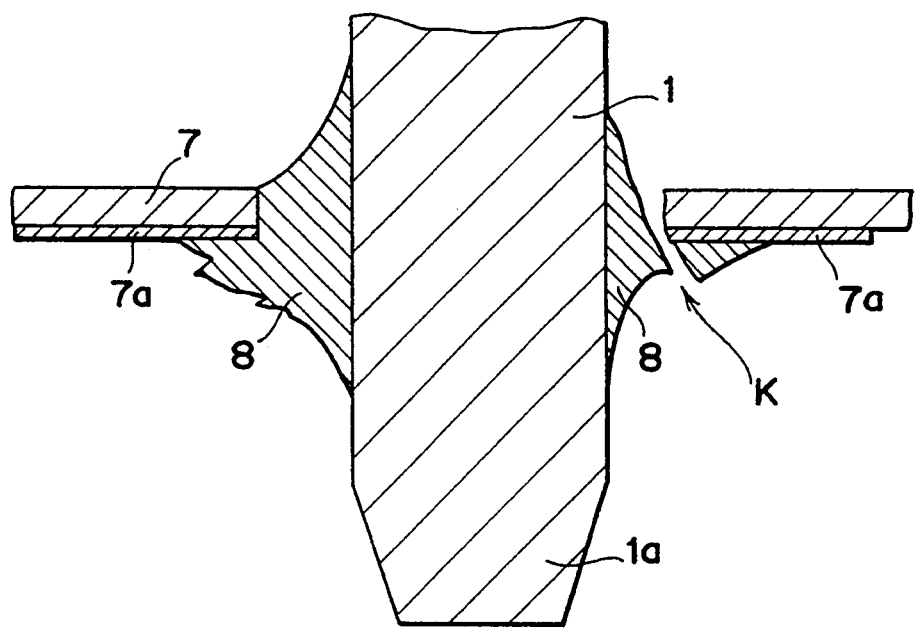
FIG. 27 is a microscopic view illustrating the breaking of the end portion 1a of a connector pin 1.

Then, FIG. 25 is a perspective view illustrating the appearance of the third embodiment of a circuit board connector according to the present invention when the connector is mounted on a board 7 in a substantially straight line, that is, keeping its original shape without any bending. Each of the circuit board connectors according to the embodiments 4 to 9 can also be mounted on a board while keeping its original shapes. By mounting a connector on a board in this way, the deformation of the entire connector block 2 due to the thermal expansion and the like can be absorbed so that the occurrence of any drawbacks such as breakage of the connector block 2 is prevented.

As described above, according to a circuit board connector and the board according to the present invention, it is possible to provide the circuit board connector and the board which do not bring upon conductivity deficiency due to the generation of crack and others.

Furthermore, in the present invention, a thermal shock test is conducted to verify the improved quality of a connector and a circuit board using the connector according to the present invention.

As a testing condition, temperature changes of −30° C. to +90° C. are given per cycle of 30 minutes.

Figure 28:
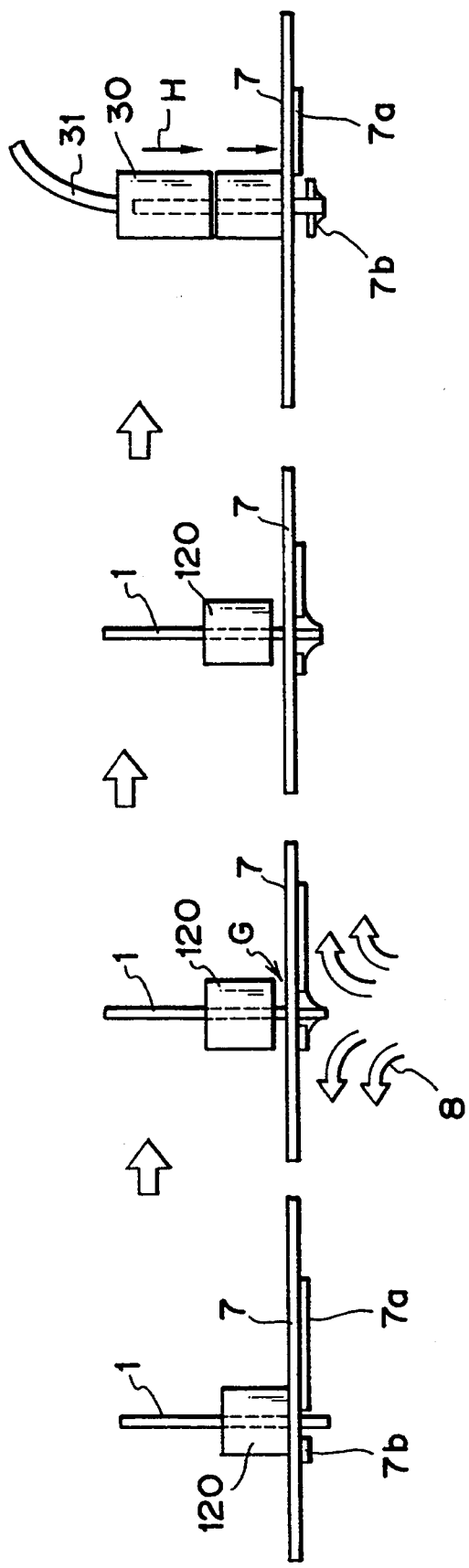
FIGS. 28A through 28D are views showing the mounting processes.
Figure 29:
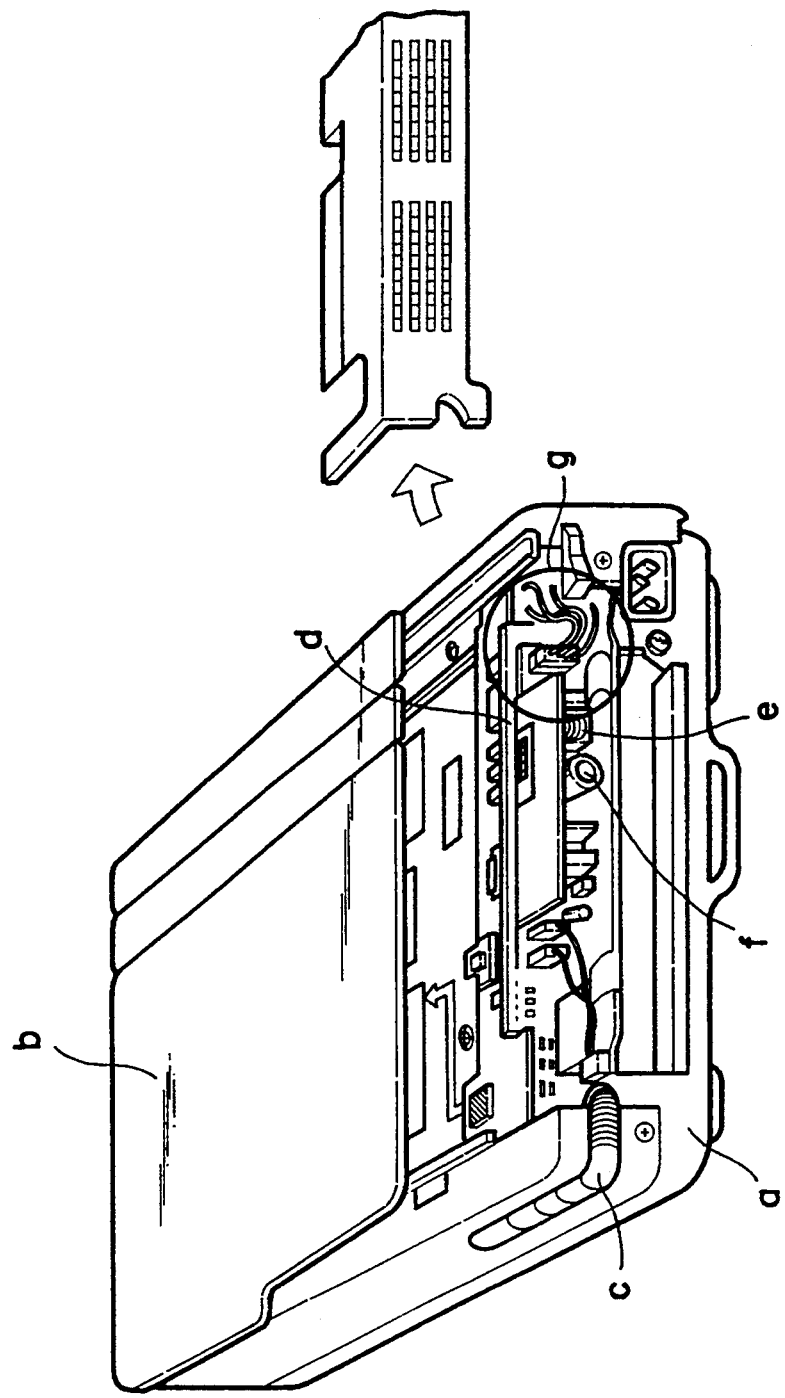
FIG. 29 is a view illustrating a machine using a connector according to the present invention.

As a result, solder breakage is generated in approximately 20 cycles in the case of the conventionally structured connector shown in FIG. 28.

In the case of each connector according to the present invention, no abnormality is observed even after 200 cycles.

It is particularly noticeable that the present invention produces a significant effect on its application to a machine of such a structure that a heat generating element such as a motor and a transformer is arranged in a location in the vicinity of the connector and circuit board as shown in FIG. 31.

What is claimed is:

1. A circuit board connector comprising:
   a block member for supporting a plurality of connector pins aligned in a row, the block being made of flexible material;
   curving portions of the block extending outwardly from a side face of the block member; and
   grooves formed by cutting the block member from an opposite side face to extend into the curving portion, each groove extending between a different pair of said connector pins along said row.

2. A circuit board connector in which a plurality of connector pins are arranged in its longitudinal direction and inserted into holes of circuit patterns in a circuit board for a subsequent soldering, said connector comprising:
   a plurality of independent connector holding portions (20, 20) for holding the plurality of connector pins in a row; and
   a plurality of connecting portions (4, 4) for resiliently connecting between the plurality of connector holding portions,
   wherein each connector holding portion and each connecting portion is made of a resin material having resilience, and
   each connecting portion extends from an outer surface of one of the connector holding portions at one end of the connecting portion to an outer surface of an adjacent one of the connector holding portions at the other end of the connecting portion to form a curved shape having a flexible portion between the one and the adjacent one of the connector holding portions, so that when the connector pins are inserted in the connector holding portions and then into holes of the circuit patterns in the circuit board, stress caused by heat upon soldering of the circuit patterns and the connector pins is absorbed by resilient deformation of the connecting portions having the flexible portions.

3. A connector according to claim 2, wherein the connecting portions extend from the same positions relative to an arrangement direction of the connector holding portions.

4. A connector according to claim 2, wherein the one end of one connecting portion connecting one of the connector holding portions and the other end of an adjacent connecting portion connecting the one connector holding portion are positioned in alternate positions relative to an arrangement direction of the connector holding portions.

5. A connector according to claim 2, wherein two of the connecting portions extend from opposite positions in the outer surface of one of the connector holding portions, and the curved shape formed by the two connecting portions is substantial symmetrical.

6. A circuit board connector in which a plurality of connector pins are arranged in its longitudinal direction and inserted into holes of circuit patterns in a circuit board for a subsequent soldering, said connector comprising:
   a connector block (2) for holding the plurality of connector pins extending in a row, said connector block being made of a resin including a resilient material;
   the plurality of connector pins being inserted into the connector block (2) at a predetermined distance;
   groove portions (3, 3) formed in the connector block between each of the connector pins from opposite side faces thereof alternatively;
   a depth (A1, A2) of each groove from the side face from which it extends being set more than a distance (B1, B2) from that side face to each connector pin;
   wherein when the connector pin is inserted into each connector holding portion and then into the hole of the circuit patterns in the circuit board, stress caused by heat upon soldering of the circuit pattern and the connector pin is absorbed by movement of pivoting around the bottom portion (2a) of the groove (3).

* * * * *

UNITED STATES PATENT AND TRADEMARK OFFICE
CERTIFICATE OF CORRECTION

PATENT NO. : 5,370,540
DATED : December 6, 1994
INVENTOR(S) : SHIGEYUKI KOBAYASHI It is certified that error appears in the above-identified patent and that said Letters Patent is hereby corrected as shown below:

ON TITLE PAGE

In [56] References Cited, under U.S. PATENT DOCUMENTS:
"4,583,801  11/1985  Zajeski" should read
--4,553,801  11/1985  Zajeski--.

In [57] ABSTRACT:
Line 2, "upon" should read --on--.
Line 3, "crack" should read --cracks--.
Line 11, "contractive" should read --contractable--.

COLUMN 1

Line 17, "printing" should read --printed--.
Line 22, "being fallen" should read --falling--.
Line 45, "are" should read --is--.
Line 64, "tens" should read --ten degrees--.

COLUMN 2

Line 2, "to the" (2nd occ.) should read --at--.
Line 5, "dimentions" should read --dimensions--.
Line 8, "of" should be deleted and "more" should read --greater--.
Line 12, "photographing" should read --photographic--.
Line 13, "breaking" should read --broken--.
Line 19, "approximatly" should read --approximately--.
Line 27, "vertified" should read --verified-- and "such" should read --such a--.
Line 31, "upon" should read --on--.
Line 54, "encountered" should read --is encountered--.
Line 64, "are" should read --is--.

UNITED STATES PATENT AND TRADEMARK OFFICE
CERTIFICATE OF CORRECTION

PATENT NO. : 5,370,540
DATED : December 6, 1994
INVENTOR(S) : SHIGEYUKI KOBAYASHI It is certified that error appears in the above-identified patent and that said Letters Patent is hereby corrected as shown below:

COLUMN 3

Line 19, "of the kind," should read --of that kind,--.
    Line 31, "upon" should read --on--.
    Line 32, "crack" should read --cracks--.
    Line 43, "contractive" should read --contractable--.
    Line 47, "others." should read --other factors.--.
    Line 52, "contractive" should read --contractable-- and "defomable" should read --deformable--.
    Line 56, "others." should read --other factors.--.
    Line 59, "contractive" should read --contractable--.
    Line 60, "defomable" should read --deformable--.
    Line 62, "for" should be deleted.
    Line 64, "others." should read --other factors.--.
    Line 67, "for" should be deleted.

COLUMN 4

Line 2, "other." should read --other factors.--.
    Line 5, "for" should be deleted.
    Line 8, "others." should read --other factors.--.
    Line 14, "contractive" should read --contractable--.
    Line 23, "member, sub-" should read --member that is sub- --.
    Line 27, "contractive" should read --contractable--.
    Line 36, "contractive" should read --contractable--.
    Line 41, "contractive" should read --contractable--.
    Line 51, "contractive" should read --contractable--.

COLUMN 5

Line 1, "by" should read --of--.
    Line 5, "pin is" should read --pins are--.

UNITED STATES PATENT AND TRADEMARK OFFICE
CERTIFICATE OF CORRECTION

PATENT NO. : 5,370,540
DATED : December 6, 1994
INVENTOR(S) : SHIGEYUKI KOBAYASHI It is certified that error appears in the above-identified patent and that said Letters Patent is hereby corrected as shown below:

COLUMN 5

Line 6, "pin" should read --pins--.
Line 7, "arrangement" should be deleted.
Line 8, "circuit" should read --a circuit--.
Line 13, "soldering said" should read --soldering. Said--.
Line 15, "contractive" should read --contractable--.
Line 16, "defectives" should read --defects--.
Line 22, "expandable" should read --expandable,-- and "contractive" should read --contractable--.
Line 24, "defectives" should read --defects--.
Line 25, "others" should read --other factors--.
Line 26, "board," should read --board--.
Line 31, "contractive" should read --contractable--.
Line 33, "defectives" should read --defects--.
Line 37, "contractive" should read --contractable--.
Line 40, "tives" should read --ts-- and "others" should read --other factors--.
Line 44, "member, substan-" should read --member that is substan- --.
Line 47, "defectives" should read --defects--.
Line 48, "others" should read --other factors--.
Line 53, "invention," should read --invention.--.
Line 58, "invention," should read --invention.--.
Line 65, "use," should read --use.--.

COLUMN 6

Line 2, "fourthe" should read --fourth-- and "embodiment," should read --embodiment.--.
Line 8, "invention," should read --invention.--.
Line 18, "variation." should read --a variation.--.

UNITED STATES PATENT AND TRADEMARK OFFICE
CERTIFICATE OF CORRECTION

PATENT NO. : 5,370,540
DATED : December 6, 1994
INVENTOR(S) : SHIGEYUKI KOBAYASHI It is certified that error appears in the above-identified patent and that said Letters Patent is hereby corrected as shown below:

COLUMN 6

Line 34, "thrid" should read --third--.
Line 60, "parts" should read --part--.

COLUMN 7

Line 16, "defined" should read --confined--.
Line 22, "portions" should read --part--.
Line 29, "portion 4" should read --portions 4--.
Line 49, "sever" should read --serve--.
Line 64, "others" should read --other materials--.
Line 66, "others." should read --other materials.--.
Line 67, "being fallen" should read --falling--.

COLUMN 8

Line 49, "connector" should read --connectors--.
Line 62, "connector" should read --connectors--.

COLUMN 9

Line 7, "ununiform" should read --nonuniform--.
Line 46, "con-constituents" should read --constituents--.
Line 62, "becomes" should read --it becomes--.

COLUMN 10

Line 7, "different" should read --a different--.
Line 12, "different" should read --a different--.

UNITED STATES PATENT AND TRADEMARK OFFICE
CERTIFICATE OF CORRECTION

PATENT NO. : 5,370,540
DATED : December 6, 1994
INVENTOR(S) : SHIGEYUKI KOBAYASHI It is certified that error appears in the above-identified patent and that said Letters Patent is hereby corrected as shown below:

<u>COLUMN 11</u>

Line 22, "shapes." should read --shape.--.
    Line 32, "crack" should read --cracks--.
    Line 33, "others." should read --other factors.--.

<u>COLUMN 12</u>

Line 4, "(20, 20)" should be deleted.
    Line 6, "(4, 4)" should be deleted.
    Line 47, "(2)" should be deleted.
    Line 52, "(2)" should be deleted.
    Line 53, "(3, 3)" should be deleted.
    Line 56, "(A1, A2)" should be deleted.
    Line 58, "(B1, B2)" should be deleted.
    Line 65, "(2a)" should be deleted.
    Line 66, "groove (3)." should read --groove.--.

Signed and Sealed this

Twentieth Day of June, 1995

Attest:

BRUCE LEHMAN

*Attesting Officer*      *Commissioner of Patents and Trademarks*